United States Patent [19]
Cho

[11] Patent Number: 5,559,049
[45] Date of Patent: Sep. 24, 1996

[54] METHOD OF MANUFACTURING A SEMICONDUCTOR DEVICE

[75] Inventor: Byung J. Cho, Kyungki-Do, Rep. of Korea

[73] Assignee: Hyundai Electronics Insustries Co., LTD

[21] Appl. No.: 507,668

[22] Filed: Jul. 25, 1995

[30] Foreign Application Priority Data

Jul. 25, 1994 [KR] Rep. of Korea .................. 94-17957

[51] Int. Cl.⁶ ................................. H01L 21/265
[52] U.S. Cl. .................. 437/44; 437/40; 437/41; 437/160; 437/164; 437/158
[58] Field of Search .................. 437/160, 164, 437/158, 44, 40 AJ, 40 GS, 40 RG, 40 SW, 41 AS, 41 GS, 41 SW, 41 RG, 41 RLD, 40 DM

[56] References Cited

U.S. PATENT DOCUMENTS

| 4,837,179 | 6/1989 | Foster et al. | 437/460 |
| 5,024,959 | 6/1991 | Pfiester | 437/44 |
| 5,053,849 | 10/1991 | Izawa et al. | 437/44 |
| 5,210,435 | 5/1993 | Roth et al. | 257/344 |
| 5,272,100 | 12/1993 | Satoh et al. | 437/44 |
| 5,286,665 | 2/1994 | Muragishi et al. | 437/44 |
| 5,324,686 | 6/1994 | Tsunashima | 437/164 |

FOREIGN PATENT DOCUMENTS

| 0044770 | 2/1988 | Japan | 437/40 SW |
| 0081268 | 3/1989 | Japan | 437/164 |
| 0268434 | 11/1991 | Japan | 437/44 |

*Primary Examiner*—Trung Dang
*Attorney, Agent, or Firm*—Fish & Richardson P.C.

[57] ABSTRACT

The semiconductor device of the present invention is formed by forming a gate electrode in the form of T-shape, forming auxiliary gates which are capacitively coupling with the T-shape gate electrode at undercut portions below both sides of T-shape gate, forming a lightly doped region in the silicon substrate below the auxiliary gate by utilizing a doped oxide film, and forming a heavily doped region connected to a lightly doped region.

Accordingly, the present invention can form a short channel length required for a highly integrated circuit device, and greatly improve the operational speed of the device by reducing channel resistance of a lightly doped region of LDD structure.

11 Claims, 6 Drawing Sheets

METHOD OF MANUFACTURING A SEMICONDUCTOR DEVICE

BACKGROUND OF INVENTION

1. Field of the Invention

The present invention relates to a semiconductor device and a method of manufacturing the same, and particularly, to a semiconductor device having a short channel length and a high current driveability required for a super highly integrated circuit device.

2. Information Disclosure Statement

For a super highly integrated circuit device such as a giga DRAM, an MOS transistor having a channel length below 0.1 μm is required. To embody such requirement, the width of a gate electrode shall be equal to the channel length. However, it is impossible to form a pattern having a size of 0.1 μm by the conventional I-Line stepper or Excimer Laser Lithography technology. In addition, a lightly doped region($n^-$ region or $p^-$ region) of LDD(lightly doped drain) structure requires an extremely shallow junction depth of 0.01–0.03 μm. A shallow junction abruptly increases a series resistance of channel region at the time of operation of a semiconductor device, thereby degrading current driveability. Furthermore, the operational speed of the device is decreased.

SUMMARY OF THE INVENTION

Therefore, the purpose of the present invention is to provide a semiconductor device and a method of manufacturing the same which can form a short channel length required for a highly integrated circuit device, and reduce the channel resistance of a lightly doped region in LDD structure so as to improve the operational speed of the device.

To achieve the above object, a semiconductor device according to the present invention, comprising:

A semiconductor device having a gate electrode and a source and drain regions of an LDD structure, wherein auxiliary gates are formed to electrically float against a lightly doped region to electrically control the resistance of the lightly doped region.

A method of manufacturing a semiconductor device according to the present invention, comprising the steps of:

forming a gate oxide film and a T-shape gate electrode on a silicon substrate; sequentially forming a doped oxide film and a thick polysilicon layer thin on top of entire structure of the silicon substrate including the T-shape gate electrode, and thereafter, forming auxiliary gates at undercut portions below both sides of the T-shape gate electrode by etching the polysilicon layer and doped oxide film by a blanket etching process; forming heavily doped regions in the silicon substrate at both sides of the T-shape gate electrode by a high concentration impurity implantation process; and performing a heat treatment process for surface planarization after depositing an inter-insulation film on the entire structure of the silicon substrate including the T-shape gate electrode, and forming a lightly doped region by diffusion toward the silicon substrate of dopants contained in the doped oxide film during the heat treatment process.

BRIEF DESCRIPTION OF THE DRAWINGS

To better understand the nature and the object of the present invention, reference should be made to the following detailed descriptions made in conjunction with the accompanying drawings in which.

Similar reference characters refer to similar parts through the several views of the drawings.

DETAILED DESCRIPTION OF THE INVENTION

Figure 1:
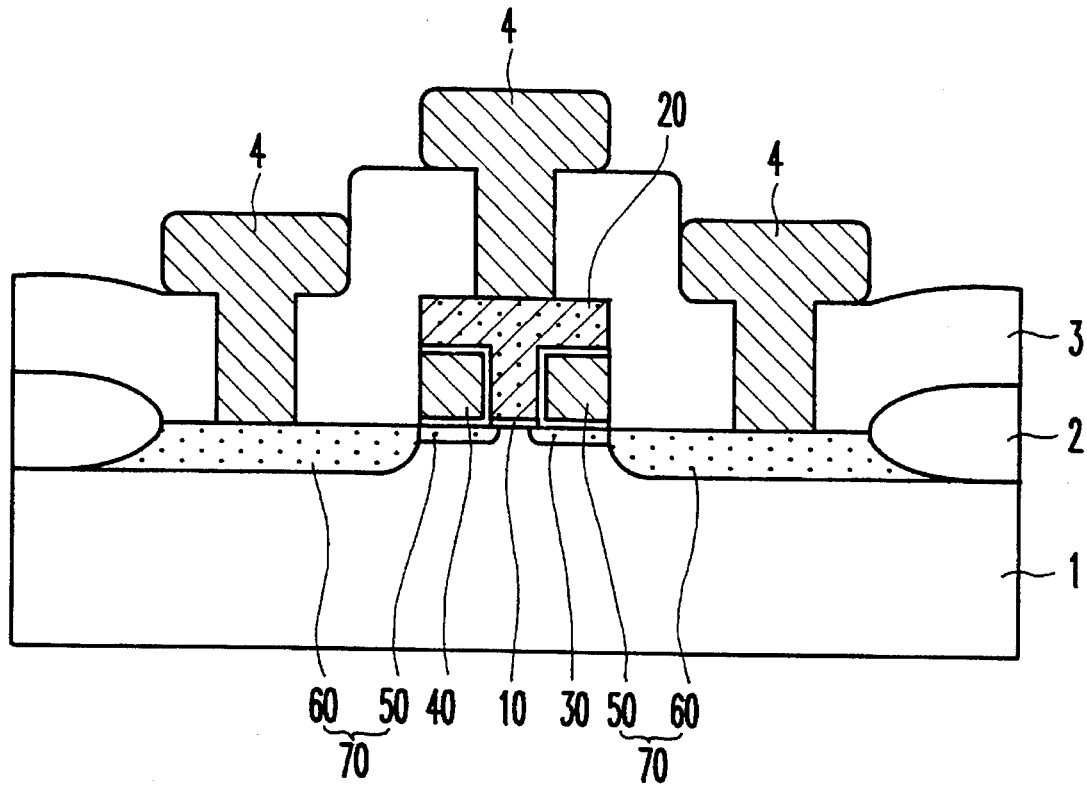
FIG. 1 is a sectional view of a semiconductor device manufactured according to the present invention.

Referring to FIG. 1, a gate oxide film 10 is formed on a silicon substrate 1 to have a very small width. A T-shape gate electrode 20 having a vertical portion 20A and a horizontal portion 20B is formed on the gate oxide film 10. Doped or undoped oxide films 30 are formed on the lower surface of the horizontal portion 20A, the surface of the vertical portion 20B and a selected portion of the silicon substrate. Auxiliary gates 40 are formed on the oxide films 30 of the undercuts of the T-shape gate electrode 20 so that the auxiliary gates 40 are capacitively coupled to the T-shape gate electrode 20 and electrically floating with a lightly doped region 50. The lightly doped region 50 is formed to have a shallow depth in the silicon substrate 1 below the auxiliary gate 40 and a heavily doped region 60 is formed to be connected to the lightly doped region 50. Therefore, source and drain regions 70 of LDD structure are formed by a lightly doped region 50 and a heavily doped region 60, thereby forming a memory cell. An inter-insulation film 3 is formed on the entire structure of silicon substrate 1 including the memory cell. Metal wires 4 are formed by a metal contact process to be connected to the T-shape gate electrode 20 and the source and drain regions 70.

FIGS. 2A through 2F are sectional views illustrating steps of manufacturing a semiconductor device having the above-described construction according to a first embodiment of the present invention.

Figure 2A:
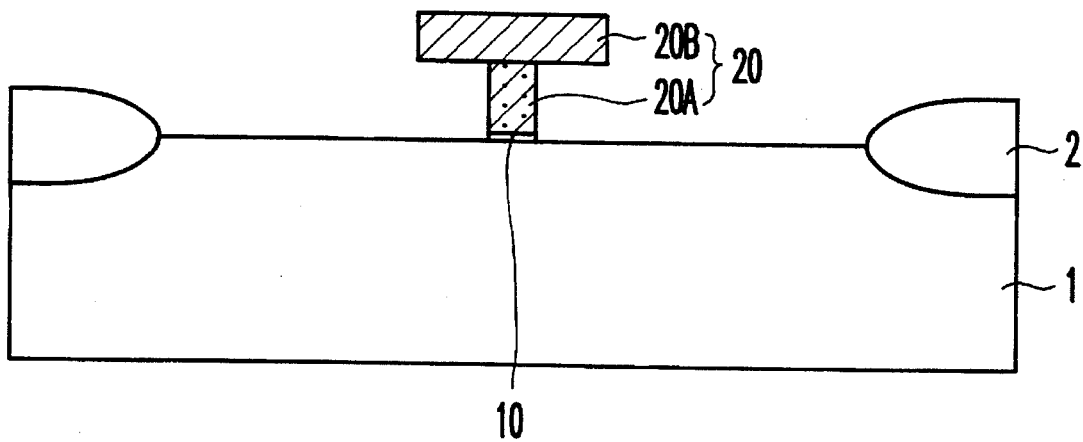
FIGS. 2A through 2F are sectional views of a semiconductor device to illustrate steps of manufacturing a semiconductor device according to a first embodiment of the present invention.

Referring to FIG. 2A, a field oxide film 2 is formed on the silicon substrate 1 to define an active region. A gate oxide film 10 is formed on the entire structure. A doped polysilicon layer 20A and an undoped polysilicon layer 20B are sequentially formed on the gate oxide film 10. A dry etching process using a gate mask and a wet etching process are sequentially performed, thereby forming a T-shap gate electrode 20 having undercuts. An exposed portion of the gate oxide film 10 is removed by a cleaning process.

In case of manufacturing a semiconductor device of the present invention as NMOS structure, the T-shape gate electrode 20 is formed by continuously depositing a silicon doped with n-type impurity and a silicon not doped with impurity, here the condition of deposition being that the deposition is performed with the amorphous silicon below 600° C. constraining dopant diffusion from the doped silicon layer to the undoped silicon layer, by patterning the undoped silicon layer and the doped silicon layer through a gate electrode mask operation by an I-line stepper or an excimer laser lithography which are prior art exposing system, and thereafter, by activating impurities in the doped silicon layer by heat treating for 0.5–5 hours at the temperature range of 600°–750° C. and at the same time polycrystallizing the impurities under the condition that the impurities are not diffused to the undoped silicon layer, and by performing an etching process in a poly wet etching solution having a composition ratio of $HNO_3:CH_3COOH:HF:H_2O=$ 21:3:0.25– 1.0:10–16. In case of patterning a poly gate to a thickness of 0.25–0.3 μm using the exposing system, due to the characteristics that the etching ratio of doped polysilicon 20A:undoped polysilicon 20B in the poly wet etching solution is 60–80:1 which is a great difference, it is possible to make the lower doped polysilicon 20A with a very small width of 0.05–0.1 μm while maintaining the upper undoped polysilicon 20B with a width of 0.25–0.3 μm.

In case of manufacturing the semiconductor device of the present invention as a PMOS structure, the process of forming the the only difference being that p-type impurity is used instead of n-type impurity.

In the above process, Sb, P and As, etc. are used as n-type impurities and boron(B) is used as p-type impurity.

Figure 2B:
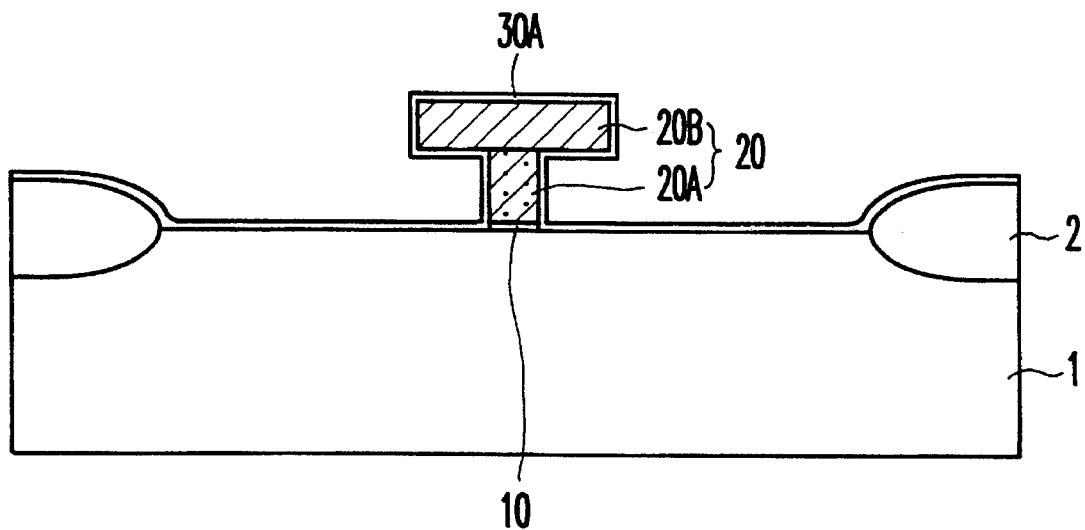

FIG. 2B shows a formation in which a doped oxide film 30A doped with impurity is thinly deposited on the entire structure of the silicon substrate 1 including the T-shape gate electrode 20.

The doped oxide film 30A is formed to a thickness of about 100–200 Å, and is formed by depositing a PSG for NMOS structure and by depositing a BSG or BPSG for PMOS structure.

Figure 2C:
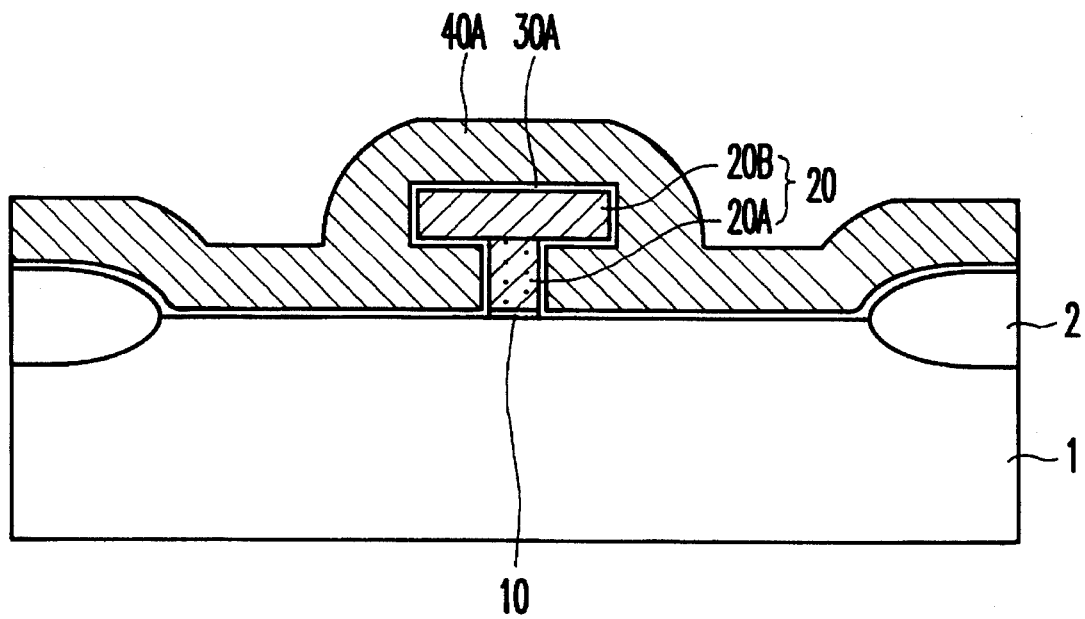

FIG. 2C shows a formation in which a polysilicon layer 40A is thickly formed on the doped oxide film 30.

The polysilicon layer 40A is formed to thickness of about 1000–2000 Å, and can be formed in a condition of being not doped with impurity, however, preferably $n^+$ polysilicon is used for NMOS structure and $p^+$ polysilicon is used for PMOS structure.

Figure 2D:
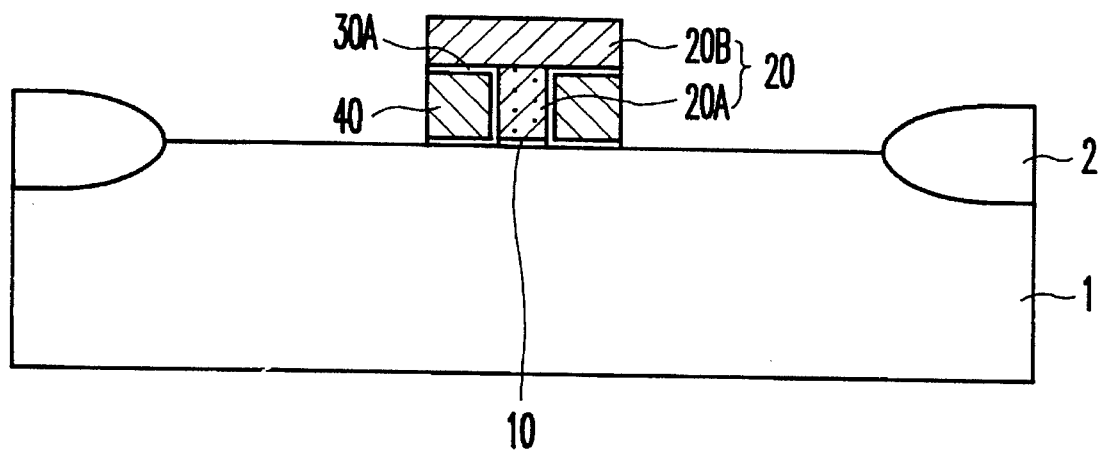

FIG. 2D shows a formation in which the auxiliary gates 40 are formed at the undercuts of the T-shape gate electrode 20 by sequentially etching the polysilicon layer 40A and the doped oxide film 30A.

Since the auxiliary gate 40 is floated against the T-shape gate electrode 20 and the silicon substrate 1 by the doped oxide film 30A, it is capacitively coupled to the T-shape gate electrode.

Figure 2E:
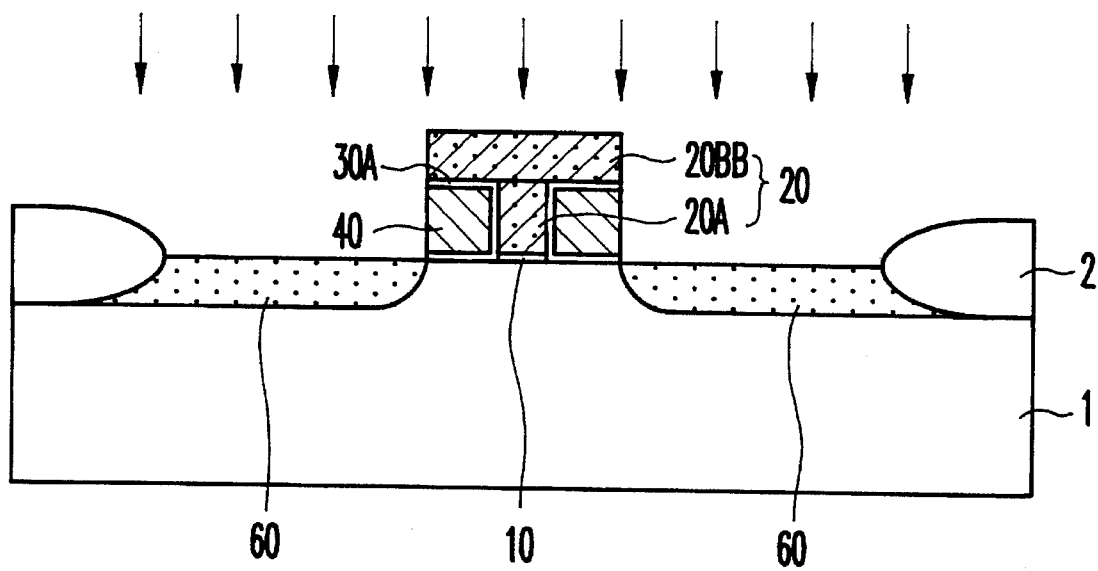

FIG. 2E shows a formation in which the highly doped regions 60 are formed in the silicon substrate 1 by performing a high concentration impurity implantation process. At this time, the undoped polysilicon layer 20BB which is the upper layer of the T-shape gate electrode 20 is transformed into a doped polysilicon layer 20B by the high concentration impurity implantation process.

At the time of the impurity implantation process, the heavily doped region 60 becomes an $n^+$ region or a $p^+$ region by implanting As ion (for NMOS structure) or Boron(B) ion (for PMOS structure) of high concentration.

Figure 2F:
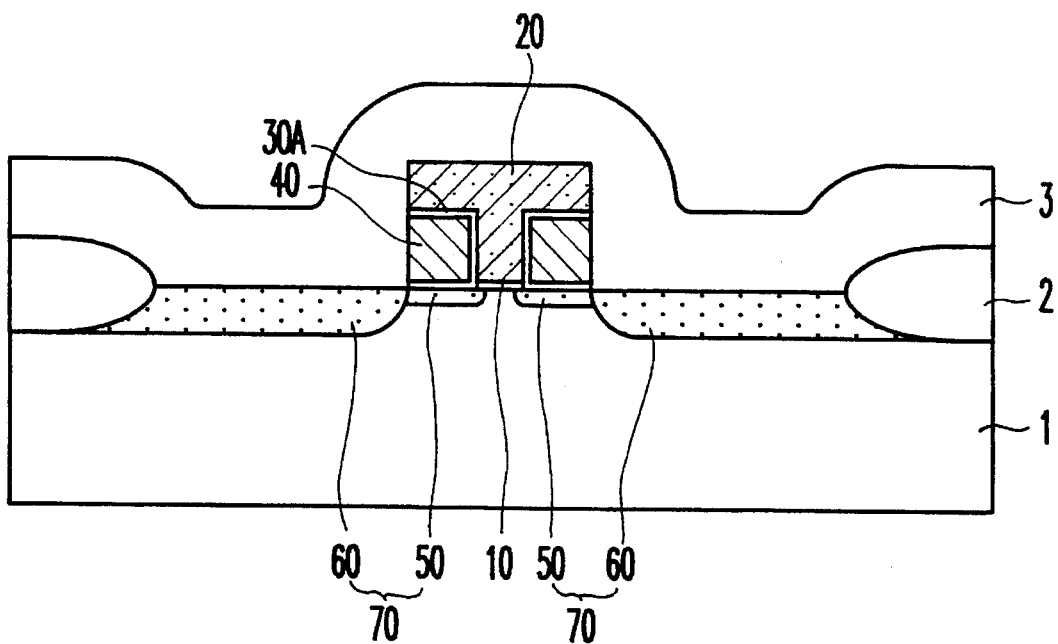

FIG. 2F shows a formation in which an inter-insulation film 3 is formed on the entire structure of the silicon substrate 1 including the T-shape gate electrode 20, and the lightly doped region 50 connected to the heavily doped region 60 is formed by diffusion toward the silicon substrate 1 of dopants which were contained in the portion of the doped oxide film 30A below the auxiliary gate 40 at the time of formation of the inter-insulation film 3.

The inter-insulation film 3 is usually formed by performing a heat treatment process for planarization after TEOS and BPSG are deposited. The lightly doped region 50 is formed by diffusion toward the silicon substrate 1 of dopants which were contained in the portion of the doped oxide film 30A below the auxiliary gate 40 at the time of heat treatment process for forming the inter-insulation film 3. That is, since the doped oxide film 30A is composed of PSG in case of NMOS and is composed of BSG or BPSG in case of PMOS, P contained in PSG or B constrained in BSG and BPSG at the time of heat treatment process for planarization so that the lightly doped region 50 becomes $n^-$ region or $p^-$ region.

Thereafter, the semiconductor device of the present invention is completed by forming the metal wires 4 connected to the T-shape gate electrode 20 and source and drain regions 70 respectively by performing the metal contact process as shown in FIG. 1.

FIGS. 3A through 3E are sectional views to illustrate steps of manufacturing a semiconductor device according to a second embodiment of the present invention.

Figure 3A:
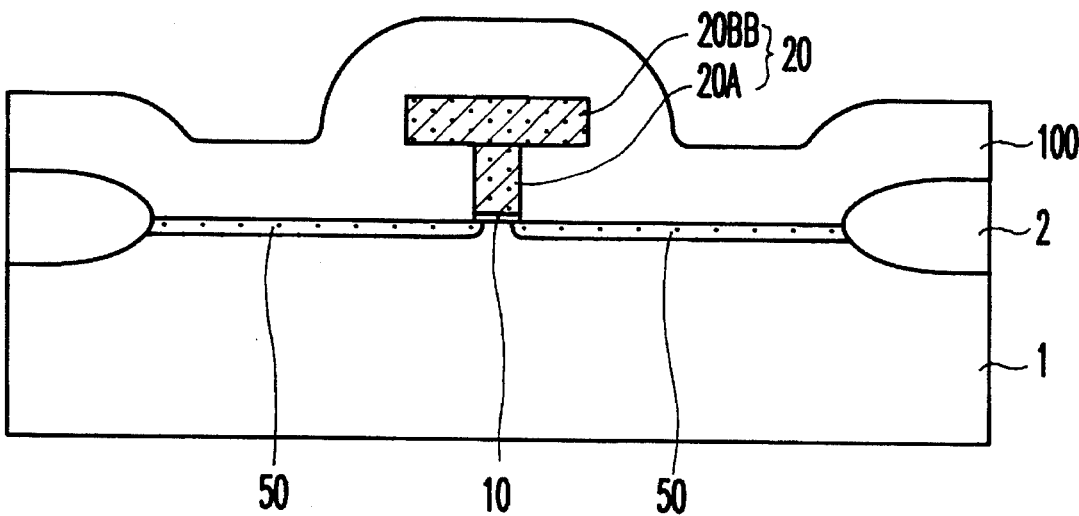
FIGS. 3A through 3E are sectional views of a semiconductor device to illustrate steps of manufacturing a semiconductor device according to a second embodiment of the present invention.

FIG. 3A shows a formation in which the lightly doped region 50 is formed at the surface of the silicon substrate 1 by solid phase diffusion by performing the same process as described in relation with FIG. 2A, thickly depositing a doped oxide film 100 on top of the entire structure of the silicon substrate 1 including the T-shape gate electrode 20 to a thickness of order of 1000–2000 Å, and heat treating at the temperature of 820°–900° C.

At this time, the undoped polysilicon layer 20B which is the upper layer of the T-shape gate electrode 20 is transformed to the doped polysilicon layer 20BB by the dopants diffused from the doped polysilicon layer 20A which is the lower layer.

The doped oxide film 100 is formed of PSG, BSG or BPSG which is one of the kinds of dielectric material used in the process of manufacturing a semiconductor device. In case of manufacturing a semiconductor device of the present invention as a NMOS structure, the doped oxide film 100 is formed by depositing PSG, and the lightly doped region 50 formed by the diffusion of P contained in PSG becomes $n^-$ region. In case of manufacturing a semiconductor device of the present invention as a PMOS structure, the doped oxide film 100 is formed by depositing BSG or BPSG, and the lightly doped region 50 formed by the diffusion of boron(B) contained in BSG or BPSG becomes $p^-$ region.

Figure 3B:
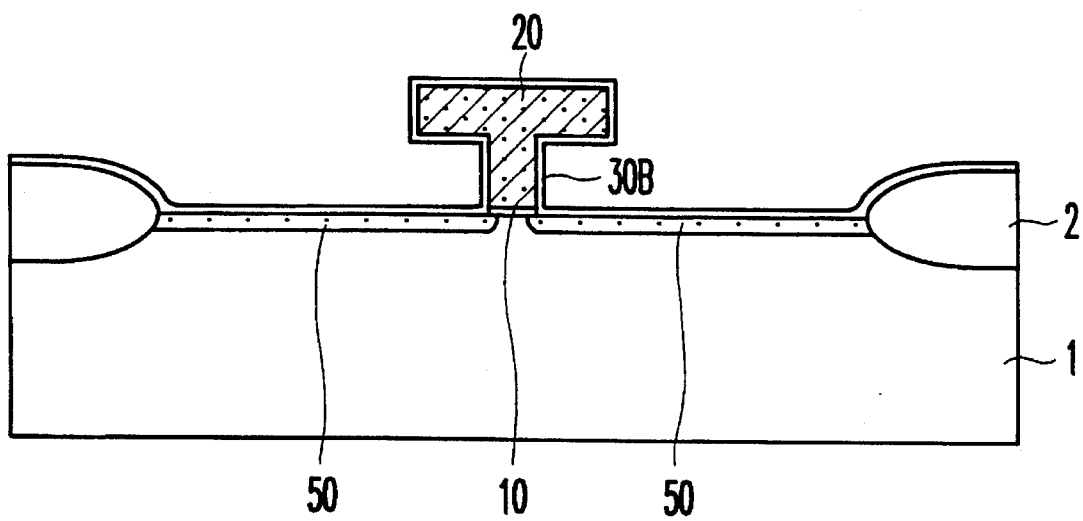

FIG. 3B shows a formation in which an undoped oxide film 30B is thinly deposited on the entire structure of the silicon substrate 1 including the T-shape gate electrode 20 after removing the doped oxide film 100.

The undoped oxide film 30B is formed of MTO (Medium Temperature Oxide) or ONO(Oxide-Nitride-Oxide) to a thickness of 100–200 Å. The undoped oxide film 30B must be formed at a temperature below 800° C. to prevent additional diffusion of the dopants(P or B) contained in the lightly doped region 50.

Figure 3C:
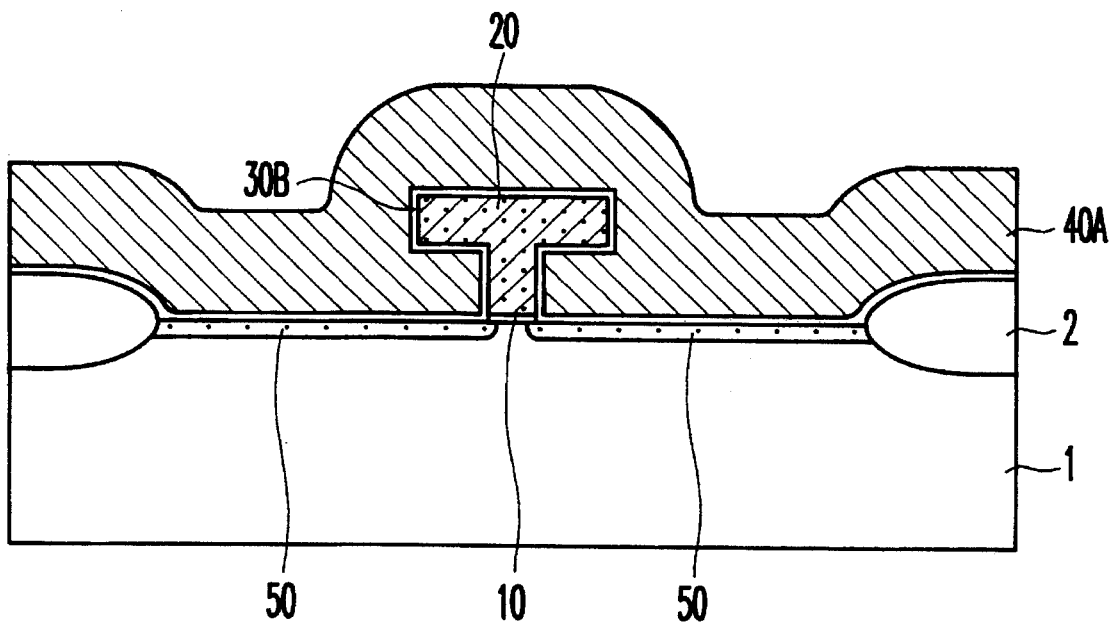

FIG. 3C shows a formation in which a polysilicon layer 40A is thickly formed on top of the undoped oxide film 30B.

The polysilicon layer 40A is formed to a thickness of 1000–2000 Å, and although it can be formed in a state that is not doped with impurities, $n^-$ polysilicon is used for NMOS structure and $p^-$ polysilicon is used for PMOS structure.

Figure 3D:
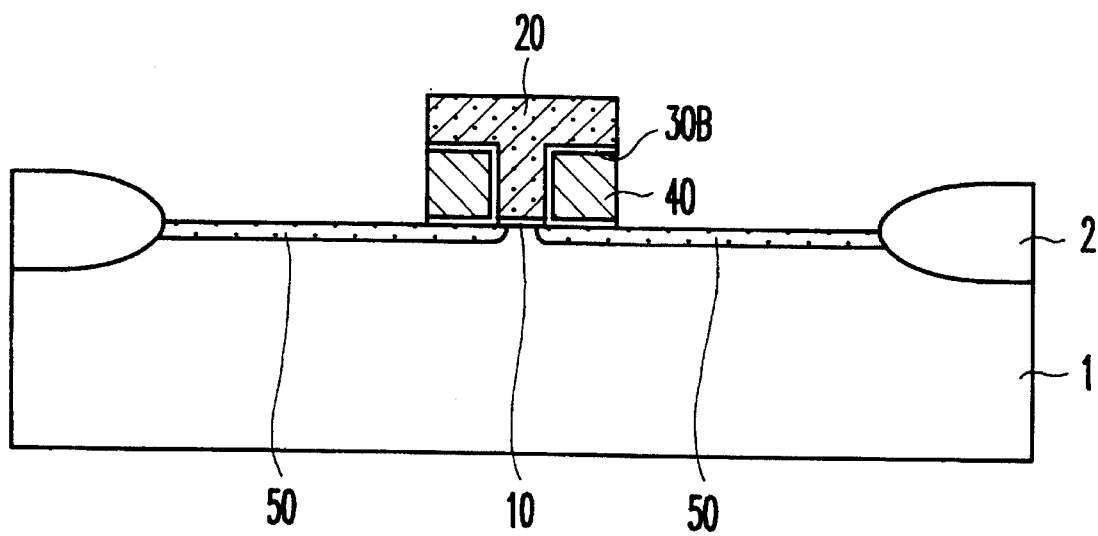

FIG. 3D shows a formation in which auxiliary gates 40 are formed at the undercut portion of the T-shape gate electrode 20 by sequentially etching the polysilicon layer 40A and the undoped oxide film 30B by the blanket etch process.

Since the auxiliary gates 40 are floating against the T-shape gate electrode 20 and the silicon substrate 1, with the thin undoped oxide film 30B between itself and the T-shape gate electrode 20 and the silicon substrate 1, they perform the services of capacitive coupling.

Figure 3E:
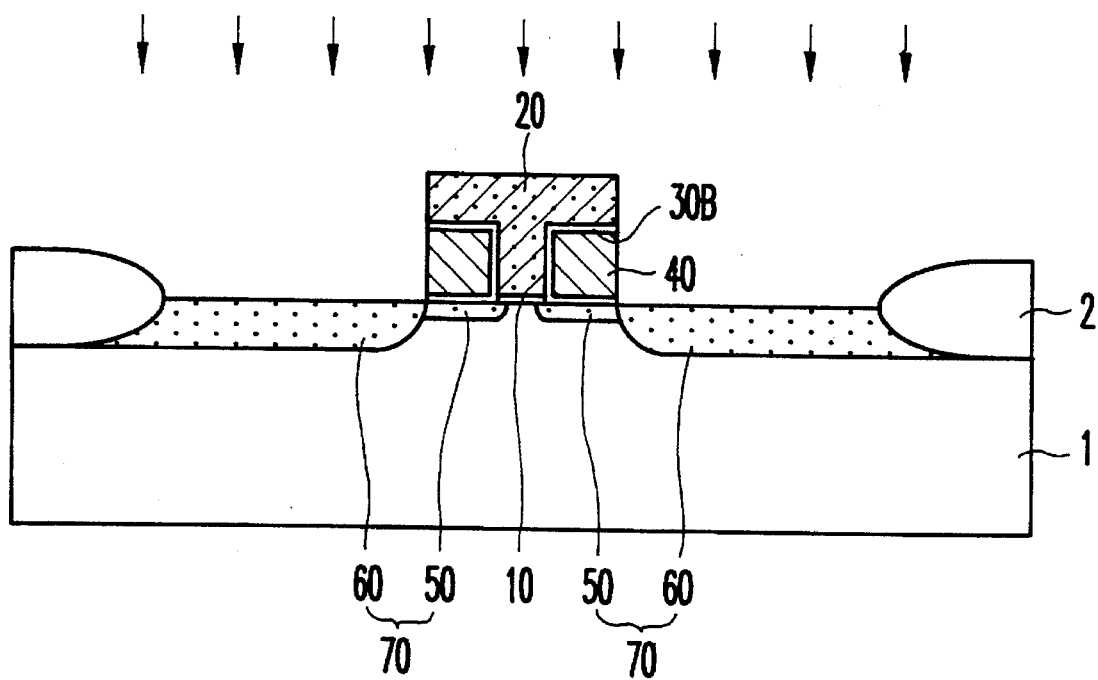

FIG. 3E shows a formation in which the heavily doped regions 60 are formed by performing the high concentration impurity implantation process.

The heavily doped regions 60 becomes $n^+$ region or $p^+$ region by implanting ions of P, As(in case of NMOS structure) or B(in case of PMOS structure)at the time of the impurity implantation process.

Thereafter, the semiconductor device of the present invention is completed by forming the metal wires 4 connected to the T-shape gate electrode 20 and source and drain regions 70 respectively by performing the metal contact process as shown in FIG. 1.

Although the first and second embodiments describe the steps of manufacturing NMOS and PMOS structure, a CMOS device also can be manufactured by applying the above described principle of the present invention.

Manufacturing the semiconductor device using the method described above has the following effects:

1) A transistor having a channel length below 0.1 µm and being a giga DRAM Class can be formed by utilizing even the conventional I-Line Stepper or Excimer Laser Lithography technology.

2) The upper width of the gate electrode is wide, thereby reducing a contact resistance, and the lower width of the gate electrode is narrow thereby increasing the short channel effect, so that the operational speed of the device can be improved.

3) A carrier concentration in the lightly doped region can be increased by forming coupling polysilicon auxiliary gates at that a channel series resistance is greatly reduced to improve a current drive capability.

4) Since a region where a peak lateral electric field is generated at drain edge due to accumulation of the carriers at the lightly doped region by the use of the coupling polysilicon auxiliary gate is moved into a real channel, a spacer-induced-degradation phenomenon due to hot carrier is removed so that the reliability of the device can be improved.

5) Since the resistance of the lightly doped region is reduced by the use of the coupling polysilicon auxiliary gate, the operation of the device is not affected by further reducing physical doping and junction depth, so that a short channel effect which is a challenge point 0.1 µm Class device can be greatly improved.

Although this invention has been described in its preferred embodiment with a certain degree of particularity, one skilled in the art would know that the preferred embodiment disclosed here is only an example and that the construction, combination and arrangement of its parts may be varied without departing from the spirit and the scope of the invention.

What is claimed is:

1. A method of manufacturing a semiconductor device comprising the steps of:

forming a gate oxide film and a T-shape gate electrode on a silicon substrate;

sequentially forming a thin doped oxide film and a thick polysilicon layer on top of entire structure of said silicon substrate including said T-shape gate electrode, and thereafter, forming auxiliary gates at undercut portions below both sides of said T-shape gate electrode by etching said polysilicon layer and doped oxide film by a blanket etching process;

forming heavily doped regions in said silicon substrate at both sides of said T-shape gate electrode by a high concentration impurity implantation process; and performing a heat treatment process for surface planarization after depositing an inter-insulation film on the entire structure of said silicon substrate including said T-shape gate electrode, and forming a lightly doped region by diffusion toward said silicon substrate of dopants contained in said doped oxide film during said heat treatment process.

2. The method of claim 1, wherein said T-shape gate electrode is formed by sequentially depositing a silicon doped with impurities and a silicon not doped with impurities in non-crystalline state, performing a gate electrode mask operation and a heat treatment process, and performing an etching process by utilizing a poly wet etching solution.

3. The method of claim 2, wherein said heat treatment process is performed for 0.5–5 hours in the temperature range of 600°–750° C.

4. The method of claim 2, wherein said poly wet etching solution is composed to a composition ratio of $NHO_3:CH_3COOH:HF:H_2O=21:3:0.25-1.0:15-16$.

5. The method of claim 1, wherein said doped oxide film is formed from PSG in case of NMOS and is formed from one of PSG and BPSG in case of PMOS.

6. The method of claim 1, wherein said doped oxide film is formed to a thickness of 100–200 Å.

7. The method of claim 1, wherein $n_+$ polysilicon is used in case of NMOS and $p^+$ polysilicon is used in case of PMOS for polysilicon layer for forming said auxiliary gate.

8. A method of manufacturing a semiconductor device comprising the steps of:

forming a gate oxide film and a T-shape gate electrode on a silicon substrate;

thickly depositing a doped oxide film on top of the entire structure of said silicon substrate including said T-shape gate electrode;

forming a lightly doped region by diffusion toward said silicon substrate of impurities contained in said doped oxide film by a high temperature heat treatment process;

removing said doped oxide film, and thereafter, sequentially forming an undoped oxide film of thin thickness and a polysilicon layer of thick thickness on the entire structure of said silicon substrate including said T-shape gate electrode, and forming auxiliary gates at undercut portions below both sides of said T-shape gate electrode by etching said polysilicon layer and undoped oxide film by a blanket etching process; and forming heavily doped regions in said silicon substrate at both sides of said T-shape gate electrode by a high concentration impurity implantation process.

9. The process of claim 8, wherein said doped oxide film is formed from PSG in case of NMOS and is formed from one of PSG and BPSG in case of PMOS.

10. The method of claim 8, wherein said undoped oxide film is formed from one of MTO and ONO.

11. The method of claim 8, wherein said undoped oxide film is formed to a thickness of 100–200 Å.

* * * * *